(12) United States Patent
Wu et al.

(10) Patent No.: US 9,088,283 B2
(45) Date of Patent: Jul. 21, 2015

(54) TOUCH DEVICE

(75) Inventors: Chao-Ming Wu, Yilan County (TW); Chin-Kuan Lin, New Taipei (TW)

(73) Assignees: LITE-ON ELECTRONICS (GAUNGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 499 days.

(21) Appl. No.: 13/397,757

(22) Filed: Feb. 16, 2012

(65) Prior Publication Data

US 2012/0147584 A1   Jun. 14, 2012

Related U.S. Application Data

(63) Continuation-in-part of application No. 12/612,668, filed on Nov. 4, 2009, now Pat. No. 8,205,997.

(30) Foreign Application Priority Data

May 3, 2011   (CN) ...................... 2011 2 0135096 U

(51) Int. Cl.
| | | |
|---|---|---|
| G01D 11/28 | (2006.01) | |
| G06F 3/041 | (2006.01) | |
| G02B 6/43 | (2006.01) | |
| H03K 17/96 | (2006.01) | |
| F21V 8/00 | (2006.01) | |

(Continued)

(52) U.S. Cl.
CPC ............ *H03K 17/962* (2013.01); *G02B 6/0078* (2013.01); *G06F 3/0202* (2013.01); *H05B 33/0857* (2013.01); *G06F 3/044* (2013.01); *H03K 2217/96079* (2013.01); *H03K 2217/960785* (2013.01)

(58) Field of Classification Search
CPC ..... G06F 3/0202; G06F 3/041; G06F 3/0412; G06F 3/0414; G06F 3/0416; G06F 3/044; G06F 3/016; G06F 3/04886; H05B 33/0857; H03K 17/962; H03K 17/9622; H03K 17/9625; H03K 2217/960785; H03K 2217/96079; G02B 6/0075; G02B 6/0078
USPC .......... 362/23.04, 23.05, 23.06, 23.07, 23.09, 362/23.1, 23.12, 23.13, 23.14, 23.16, 23.17, 362/23.19, 23.2
See application file for complete search history.

(56) References Cited

U.S. PATENT DOCUMENTS 7,348,512 B2 * 3/2008 Iohara ........................... 200/341
7,543,971 B2 * 6/2009 Lee et al. ...................... 362/616

(Continued)

*Primary Examiner* — Alan Cariaso
(74) *Attorney, Agent, or Firm* — Li & Cai Intellectual Property (USA) Office

(57) ABSTRACT

A touch device includes a light guide having a plurality of light guiding blocks, a plurality of light-emitting modules, and a plurality of touch sensing modules. Each light guiding block includes an incident surface, an emissive surface, and a bottom surface. An isolating gap is disposed between any two adjacent light guiding blocks. Each light-emitting module is disposed adjacent to the incident surface of a corresponding light guiding block for emitting light that is guided thereto, and the light is guided out of the emissive surface thereof. Each touch sensing module is disposed on the bottom surface of the corresponding light guiding block. Any one of the plurality of touch sensing modules generates a driving signal to control a corresponding light-emitting module for emitting light when sensing a corresponding light guiding block is touched. Therefore, each light guiding block can emit light independently.

20 Claims, 7 Drawing Sheets

(51) Int. Cl.
  *G06F 3/02*     (2006.01)
  *H05B 33/08*    (2006.01)
  *G06F 3/044*    (2006.01)

(56) References Cited

U.S. PATENT DOCUMENTS

| | | | |
|---|---|---|---|
| 7,705,257 B2 * | 4/2010 | Arione et al. | 200/314 |
| 7,740,390 B2 * | 6/2010 | Lee et al. | 362/612 |
| 7,959,342 B2 * | 6/2011 | Lee et al. | 362/617 |
| 7,988,310 B2 * | 8/2011 | Yamada et al. | 362/26 |
| 8,052,318 B2 * | 11/2011 | Lee et al. | 362/617 |
| 8,188,397 B2 * | 5/2012 | Miyashita et al. | 200/310 |
| 8,376,603 B2 * | 2/2013 | Chung et al. | 362/613 |
| 8,465,191 B2 * | 6/2013 | Inada et al. | 362/606 |
| 2008/0084512 A1 * | 4/2008 | Brott et al. | 349/15 |

* cited by examiner

TOUCH DEVICE

CROSS-REFERENCE TO RELATED APPLICATIONS

This U.S. Non-provisional application for patent is a continuation-in-part application of U.S. patent application Ser. No. 12/612,668 filed on Nov. 4, 2009 and claims the foreign priority benefit of China patent application no. 201120135096.4, filed on May 3, 2011. To be noted, the U.S. patent application Ser. No. 12/612,668 filed on Nov. 4, 2009 further claims the priority benefit of China patent application no. 200910158327.0, filed on Jul. 6, 2009. The entirety of each of the above-mentioned patent applications is hereby incorporated by reference herein and made a part of this specification.

BACKGROUND OF THE INVENTION

1. Field of the Invention

The present invention relates to a touch device; in particular, to a touch device related to a push-button backlight technology.

2. Description of Related Art

As technologies improve, demands of home appliance for people in everyday life also increases. Thus, controlling interfaces in accordance with home appliance diversifies, too. For example, remote control devices for televisions and air conditioners, or control panels of washing machines and refrigerators.

FIG. 1 shows a cross-sectional diagram of a traditional touch device which can be disposed on the aforementioned remote control devices or control panels. In the traditional touch device 9, a light source 90 emits light into a light guiding plate 92, and the light is transmitted to a plurality of button icons 94 through the light guiding plate 92, such that the light can penetrate the surface of each button icon 94. On the other hand, underneath each button icon 94 is disposed with a touch sensor 96 for sensing whether the button icon 94 is touched by a user. When the touch sensor 96 senses that the button icon 94 is touched by the user, the touch sensor 96 can activate the function corresponding to the button icon 94.

However, as functionality of home appliance increases, indications on the touch device are more and more complex. As these touch icons functions in cooperation with a light guiding plate, these touch icons may not display independently or indicate one of these touch icons only, therefore readability of each touch icon is degraded. Also, in order to have each button icon emit light independently, a light is generally required to be disposed under each button icon, which is known as direct-type lighting design. However, direct-type lighting needs a set light blending distance so as to emit uniform light. The light blending distance may lead to difficulty in reducing the thickness of the touch device; meanwhile, sensitivity of the touch sensor may also be decreased.

SUMMARY OF THE INVENTION

The object of the present invention is to provide a touch device having a plurality of light-emitting touch units, wherein the light emitted by each light-emitting touch unit does not interfere with each other. Thus, each light-emitting touch unit can emit light or change the color of the emitted light independently, so as to facilitate users to identify and operate the touch device.

The above-described object is achieved by a touch device including a light guide, a plurality of light-emitting modules, and a plurality of touch sensing modules. The light guide has a plurality of light guiding blocks. Each light guiding block has an incident surface, an emissive surface, and a bottom surface, and has at least an isolating gap between any two adjacent light guiding blocks. The plurality of light-emitting modules are disposed corresponding to the plurality of light guiding blocks. Each light-emitting module is disposed adjacent to the incident surface of a corresponding light guiding block for emitting light that is guided to the corresponding light guiding block, and the light is guided out of the emissive surface of the corresponding light guiding block. The plurality of touch sensing modules are disposed correspondingly to the plurality of light guiding blocks. Each touch sensing module is disposed on the bottom surface of each light guiding block. When one of the plurality of touch sensing modules senses that a corresponding light guiding block is touched, this touch sensing module generates a driving signal to control a corresponding light-emitting module to emit light.

The above-described object is achieved by a touch device including a plurality of light-emitting touch sensing units. Each light-emitting touch sensing unit includes a light guiding block, a light-emitting module, and a touch sensing module. The light guiding block having at least an incident surface, an emissive surface, and a bottom surface. The light-emitting module is adjacent to the incident surface. The light-emitting module emits light to the light guiding block through the incident surface and guides the light out of the light guiding block through the emissive surface. The touch sensing module is disposed at the bottom surface. The touch sensing module is used to sense the touch of the light guiding block and outputs a driving signal to control the light-emitting module accordingly. The light guiding block in each light-emitting touch sensing unit is formed from a light guide with at least an isolating gap.

In summary, the touch device can constrain transmitting direction of the light in each light guiding block of the light guide, such that the light transmitted from each light guiding block does not interfere with each other. When the user operates the touch device, it is easier to identify each light-emitting touch unit. Thus, it is easier to operate the remote control and control panel utilizing the present invention. Also, the present invention guides the light of the touch device into light guide from a lateral-side of the light guide, such that the light-emitting module need not be disposed under the light guide. Therefore, the thickness of the touch device may be reduced, and the sensitivity of touch sensing may be improved.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1:
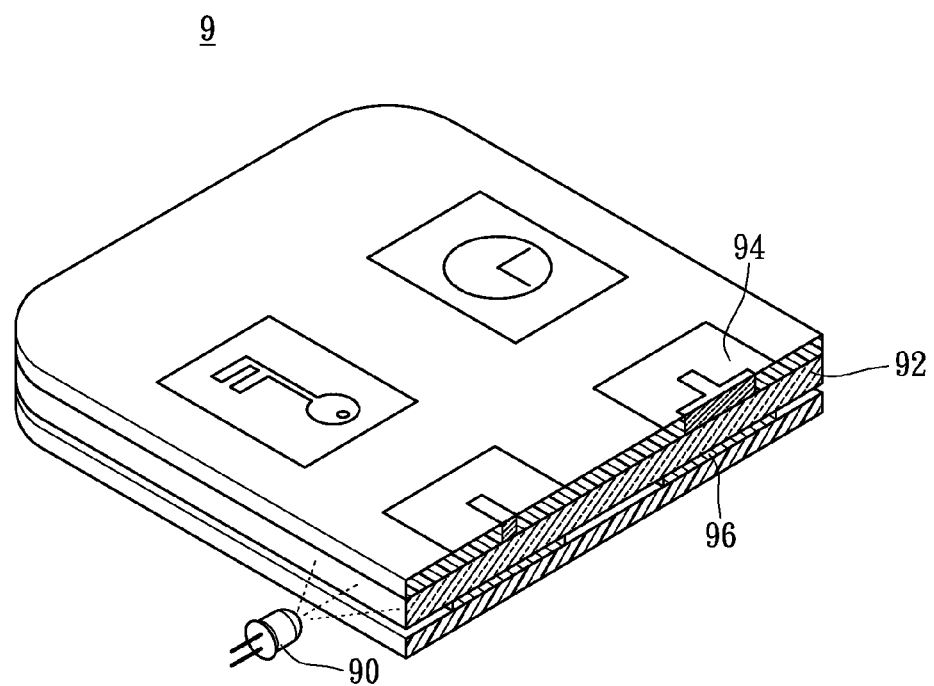
FIG. 1 shows a cross-sectional diagram of a traditional touch device.
Figure 2A:
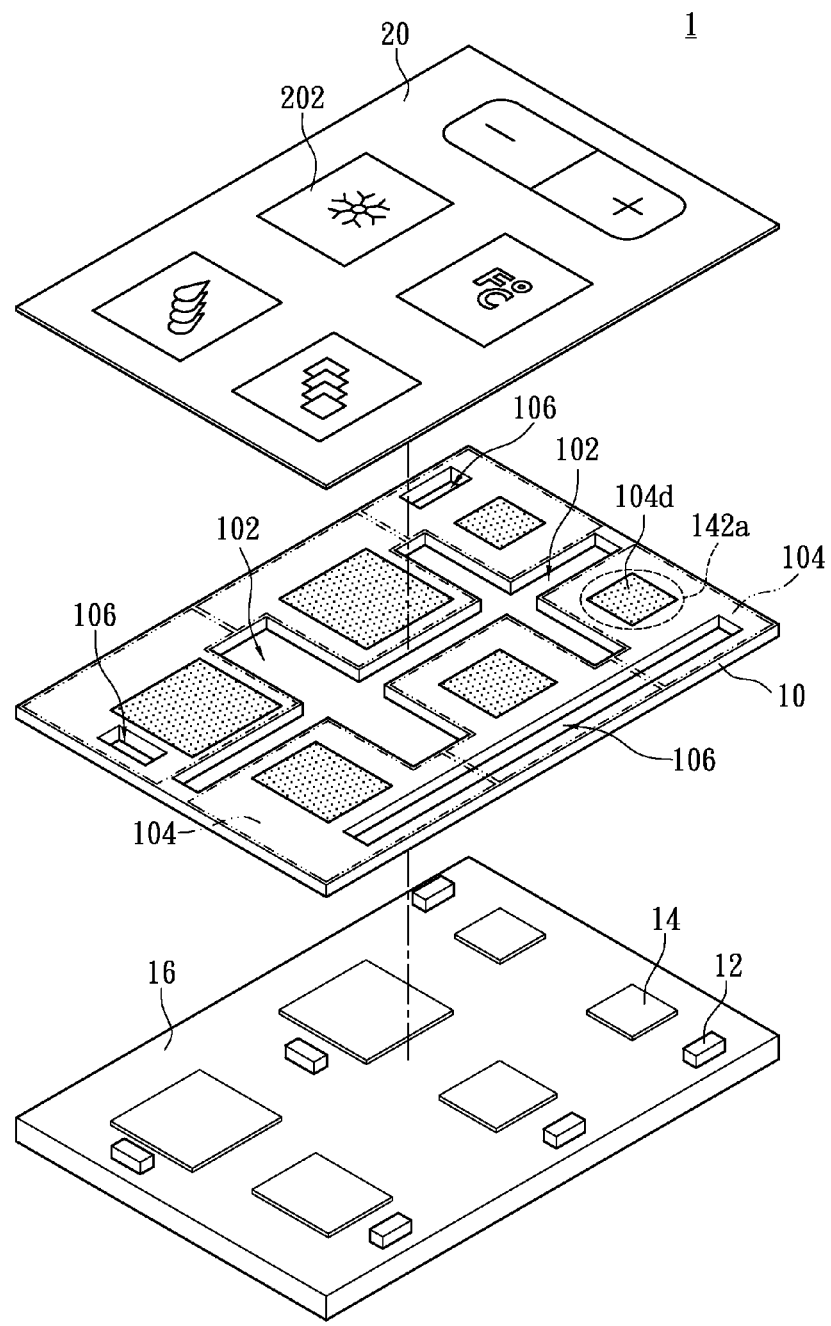
FIG. 2A shows an explosion diagram of a touch device according to a first embodiment of the present invention.
Figure 2B:
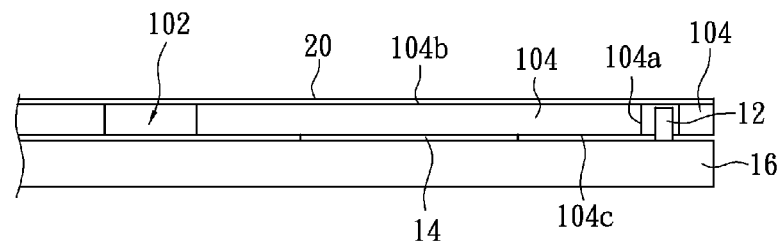
FIG. 2B shows a partial cross-sectional diagram of a touch device according to the first embodiment of the present invention.

Please refer to FIGS. 2A and 2B showing a first embodiment of the present invention. The touch device 1 includes a light guide 10, a plurality of light-emitting modules 12, and a plurality of touch sensing modules 14. The plurality of light-emitting modules 12 and the plurality of touch sensing modules 14 can be disposed on a substrate 16. When the light guide 10 is stacked on the substrate 16, the light emitted by the light-emitting module 12 can be transmitted into the light guide 10. Each element of the touch device 1 is described specifically in following paragraphs.

The light guide 10 has at least one isolating gap 102 for dividing the light guide into a plurality of light guiding blocks 104. In other words, any two adjacent light guiding blocks 104 has an isolating gap 102 therebetween. Each light guiding block 104 includes an incident surface 104a, an emissive surface 104b, and a bottom surface 104c. The light guide 10 further includes several slots 106, and each slot 106 is used to contain a corresponding light-emitting module 12. When the light guide 10 is stacked on the substrate 16, each light-emitting module 12 can be contained in the isolating gap 102 or the slot 106.

The slot 106 is usually disposed on the perimeter of the light guide 10, such as the slots 106 shown in FIG. 2A. All of the light-emitting modules 12 can be contained in the isolating gap 102 (or the slot 106), depending on the design choice. Or, some of the light-emitting modules 12 can be contained in the isolating gap 102; others of the light-emitting modules 12 can be contained in the slot 106, as long as each of the light-emitting modules 12 is corresponding to a corresponding light guiding block 104 and the light emitted from the light-emitting modules 12 does not make interference.

The incident surface 104a is adjacent to the light-emitting module 12. The incident surface 104a guides a light emitted by the light emitting module 12 into the light guiding block 104. The emissive surface 104b is adjacent to the incident surface 104a and has a light-dispersive pattern layer 104d. The light-dispersive pattern layer 104d is used to guide the light that is generated by the light-emitting module 12 out of the light guiding block 104. For real-world applications, the light guide 10 is a planar light guiding structure, and the emissive surface 104b and the bottom surface 104c are respectively the top surface and the bottom surface of the plan light guiding structure. The emissive surface 104b and the bottom surface 104c are in parallel. The incident surface 104a is a side surface between the top surface and the bottom surface of the planar light guiding structure. Thus, the incident surface 104a can be adjacent to the emissive surface 104b and the bottom surface 104c. The incident surface 104a is formed adjacent to the isolating gap 102 or the slot 106 according to the position (of the isolating gap 102 or the slot 106) where the light-emitting module 12 is disposed. The incident surface 104a is designed for receiving the light emitted by the light-emitting module 12, such that the light can be transmitted into each light guiding block 104 of the light guide 10, and the light can be transmitted in the light guide 10 by total reflection.

Figure 6:
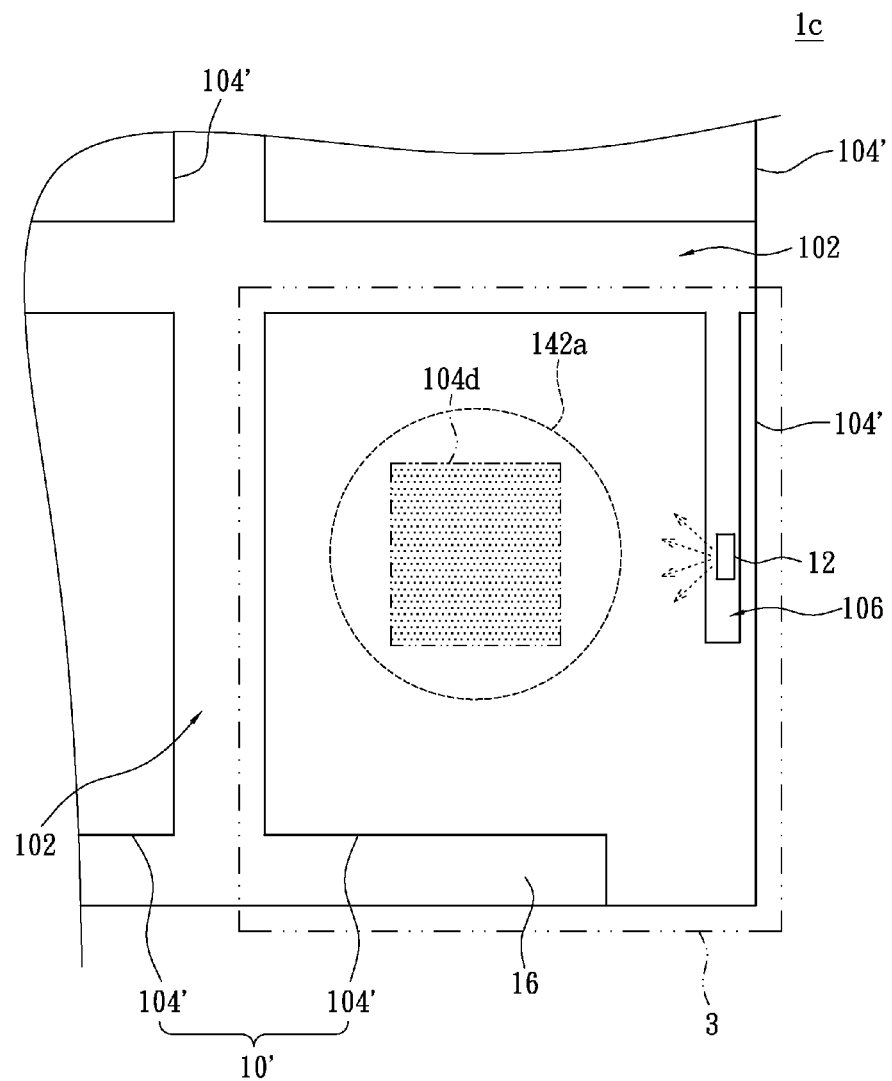
FIG. 6 shows a partial top view of a touch device according to a fourth embodiment of the present invention.

On the other hand, each light-emitting module 12, the corresponding light guiding block 104, and the corresponding touch sensing module 14 can form a light-emitting touch unit (e.g. the light-emitting touch unit 3 in FIG. 6). Each light-emitting touch unit 3 can independently control the light of the corresponding light-emitting module 12 through the corresponding touch sensing module 14. In this embodiment, the light guide 10 is divided into a plurality of light guiding blocks 104 by the isolating gap 102. The light guiding block 104 of each of the light-emitting touch units 3 is partially connected to the light guiding block 104 of the adjacent light-emitting touch unit 3, such that the light guide 10 is still a single plate. Accordingly, it is easy to dispose the light guide 10 on the substrate 16 for aligning with each of the touch sensing modules 14.

Additionally, the light-dispersive pattern layer 104d on the emissive surface 104b can be an ink pattern layer, a sand-blasted pattern layer, or a printed dot pattern layer for modifying the condition of total reflection in the corresponding light guiding block 104, such that the light can penetrate the light guiding block 104 through the emissive surface 104b. However, the fabrication method of the light-dispersive pattern layer 104d is not restricted thereto, and the area of the emissive surface 104b covered by the light-dispersive pattern layer 104d can be adjusted.

For example, an indication panel 20 may be disposed on the light guide 10, and the sizes of the light guide 10, the indication panel 20, and the substrate 16 are roughly the same, such that the outline of the stacked touch device 1 is flat. The indication panel 20 has at least a transparent region 202 for showing a symbol or a drawing pattern. If the symbol (or drawing pattern) is in a large size, the area of the light-dispersive pattern layer 104d covering the emissive surface 104b may be increased accordingly. Thus, the light emitted by the light-emitting module 12 can penetrate the transparent region 202 of the indication panel 20 from the emissive surface 104b for showing the symbol (or drawing pattern). Also, the indication panel 20 can be a pattern tape, and the pattern tape with such a thin thickness (e.g. 0.2 mm) can be directly adhered to the light guide 10 by the adhesive surface of the pattern tape.

Please note that, the isolating gap 102 can be used to isolate the light in any two adjacent light guiding blocks 104. More specifically, the isolating gap 102 may be of air medium, and the refractive index is about 1. The light guide 10 is used to guide the light, and the refractive index of the light guide 10 is usually much higher than 1. In other words, when any light guiding block 104 of the light guide 10 transmits the light to the isolating gap 102, the light is going from a medium of higher refractive index, i.e. optically denser medium, to a medium of lower refractive index, i.e. optically thinner medium, and the light would refract away from the normal line of an exit surface. Therefore, on the condition that the light guide 10 has the isolating gap 102, the light penetrating from the light guiding block 104 would refract out towards surroundings from the exit surface, such that the light is not likely to enter any horizontally adjacent light guiding block 104. Accordingly, the present invention can effectively isolate the light in each light guiding block 104 by using the isolating gap 102 with a proper width. For example, the width of the isolating gap 102 may be 3 mm to 5 mm.

Shape of the isolating gap 102 is not restricted thereto. As long as the light in any two adjacent light guiding blocks 104 would not interfere with each other, an artisan of ordinary skill in the art will appreciate how to alter the light guide 10 and the isolating gap 102.

The light-emitting module 12 is used to generate light, such that the light guiding block 104 corresponding to each light-emitting module 12 can emit light for a user to observe. For real-world applications, the two light-emitting modules 12 of any two adjacent light guiding blocks 104 may not be disposed back-to-back. The distance of each of the light-emitting modules 12 may be as far as possible. The light-emitting module 12 includes a light-emitting diode, or other proper light-emitting element, but the present invention is not so restricted. For example, the light-emitting module 12 can be composed of a plurality of light-emitting diodes, and each light-emitting diode can emit light with different wavelength. The light-emitting module 12 can select a single light-emitting diode or several light-emitting diodes to emit light with any assigned wavelength.

The plurality of touch sensing modules 14 contacts a bottom surface 104c of the light guide 10 respectively. Each touch sensing module 14 corresponds to one of the light guiding blocks 104. In other words, there is a touch sensing module 14 under any light guiding block 104. When the touch sensing module 14 senses that the corresponding light guiding block 104 is touched, the touch sensing module 14 outputs a driving signal to control the light-emitting module 12. The touch sensing module 14 may include a touch sensing conductor and a touch sensing element, as following specific description. The touch sensing conductor can sense whether the corresponding light guiding block 104 is touched. The touch sensing element can detect variation of the equivalent capacitance of the touch sensing conductor.

Figure 3:
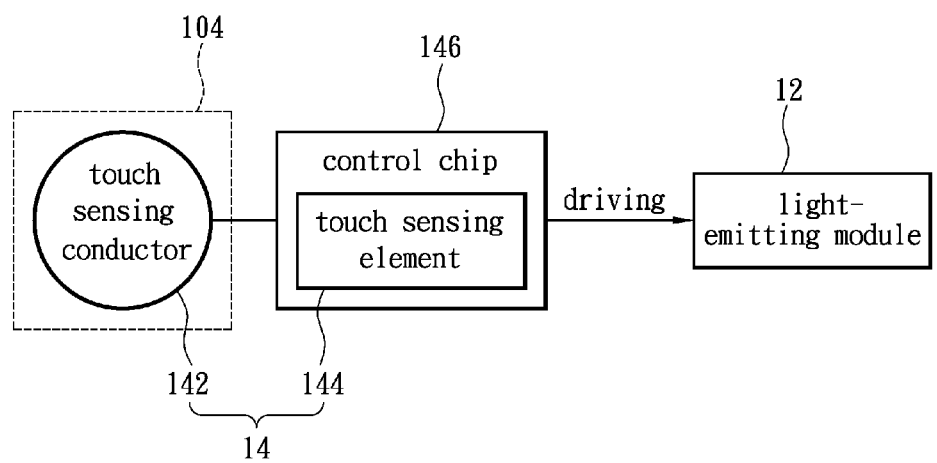
FIG. 3 shows a schematic diagram of touch devices according to embodiments of the present invention.

As shown in FIG. 3, each touch sensing module 14 includes a touch sensing conductor 142 and a touch sensing element 144. For real-world applications, the touch sensing element 144 can be integrated into a control chip 146. As the corresponding light guiding block 104 is touched, the touch sensing element 144 can output the driving signal to the light-emitting module 12 according to variation of the equivalent capacitance of the touch sensing conductor 142, thereby determining the method of how to light the light-emitting module 12. Also, the control chip 146 may be integrated with the touch sensing element 144 of each touch sensing module 14. When different light guiding blocks 104 are touched, the control chip 146 can selectively drive the light-emitting module 12 by detecting the touch sensing element 144 inside the control chip 146. Accordingly, the usage of electric circuit element can be saved by using the control chip 146.

In the viewpoint of operation, if the indication panel 20 is disposed on the light guide 10, the user can touch the symbol or drawing pattern of the indication panel 20. The touch sensing module 14 can determine whether the light guiding block 104 is touched by detecting the variation of the equivalent capacitance of the indication panel 20, the light guiding block 104, and other peripheral elements. When the touch sensing module 14 determines the light guiding block 104 is touched, the corresponding touch sensing module 14 outputs a driving signal to the light-emitting module 12 for controlling the light-emitting module 12 to emit light or to change the wavelength of the emitted light. Accordingly, the touch sensing module 14 can determine the method of how to light the light-emitting module 12.

For example, when the light-emitting module 12 is not emitting light, if the touch sensing conductor 142 senses the corresponding light guiding block 104 is touched by an object, the touch sensing module 14 can turn-on the light-emitting module 12 so as to emit light. On the contrary, if the light-emitting module 12 is emitting light, then when the touch sensing conductor 142 senses that the touch sensing conductor 142 is touched by an object, the touch sensing module 14 can turn-off the light-emitting module 12 so as to not emit light or change the color of the light emitted by the light-emitting module 12. In actuality, the touch sensing conductor 142 can be a detecting point of the capacitance. When a finger of the user touches the corresponding light guiding block 104, an induced charge can be excited from the corresponding light guiding block 104 to the touch sensing conductor 142, such that the capacitance could be changed. Then, the touch sensing element 144 determines whether the corresponding light guiding block 104 is touched by detecting variation of the equivalent capacitance of the corresponding light guiding block 104. It should be noted that any object which can make the touch sensing conductor 142 to excite the induced charge can be used for turning-on the light. The object is not restricted to the part of the human body.

The touch sensing conductor 142 of the touch sensing module 14 has a sensing range 142a (as shown in FIG. 2A) being a region by which being touched by the user can be effectively sensed. The size of the sensing range 142a may be proportional to the size of the touch sensing conductor 142. Generally speaking, the size of the sensing range 142a is likely to equal to or larger than the size of the touch sensing conductor 142, and the size of the sensing range 142a is roughly equal to the touch region where the finger of the user is pressed down on. For example, the sensing range 142a is roughly equal to a disk with diameter of 10 mm. Also, in the present invention, the substrate 16 is a printed circuit board (PCB), and electric elements which have other functions can be disposed on the substrate 16. For example, when the touch device 1 is made as a controller, a function circuit corresponding to the controller can be disposed on the substrate 16. The mentioned printed circuit board (PCB) may be a flexible printed circuit board or a non-flexible printed circuit board.

It is worth mentioning that the light-emitting module 12 is disposed at a lateral-side of the light guide 10, i.e. each of the light-emitting modules 12 is disposed near to the emissive surface 104a of respective light guiding blocks 104, and is not disposed under the light guide 10, such that the thickness of the touch device 1 can be significantly reduced. Traditionally, the conventional light-emitting module is disposed under the conventional light guide, and the total thickness of the conventional light guide and the conventional light-emitting module is about to 2.8 mm. The present invention disposes the light-emitting module 12 at a lateral-side of the light guide 10 and makes the total thickness of the light guide 10 (approximately 0.6 mm) and the indication panel 20 (approximately 0.2 mm) reduce to 0.8 mm. The thickness of the touch sensing module 14 can be neglected, because the thickness of the touch sensing module 14 is only from 0.0356 mm to 0.0712 mm.

Under utilizing the capacitive touch sensing technology, if the total thickness is reduced, a smaller touch sensing module 14 can be used to sense the same sensing range, such that the sensitivity of the touch sensing module 14 can be effectively improved. For example, when determining whether the light guide 10 is touched, variation of equivalent capacitance sensed by the touch sensing module 14 equal to 13 pF is usually a standard value. If the touch sensing module 14 senses the variation of equivalent capacitance being less than 13 pF, the touch sensing module 14 determines the light guide 10 is not touched; otherwise, if the touch sensing module 14 senses that the variation of equivalent capacitance being larger than 13 pF, the touch sensing module 14 determines the light guide 10 is touched. Usually, size of the touch sensing conductor of the traditional touch sensing module may be 10 mm in diameter for effectively sensing the mentioned variation of equivalent capacitance. However, by using the present invention to reduce the thickness of the light guide 10, diameter of the touch sensing conductor 142 of the touch sensing module 14 may be reduced to 8 mm for sensing the same variation of equivalent capacitance. In other words, 36% area of touch sensing conductor 142 has been reduced after utilizing the present invention, such that the associated cost can be reduced.

For real-world applications, when utilizing the touch device 1 of the present invention to a remote control, touching the corresponding symbol (or drawing pattern) on the indication panel 20 not only can switch on or off the light of the symbol (or drawing pattern) being touched but also can operate a predetermined function. For example, when utilizing the touch device 1 of the present invention to a remote control of the air conditioner, symbols (or drawing patterns) may be corresponded with functions of turning-on/off air conditioning, turning-on/off dehumidifying, increasing/decreasing the temperature, or displaying the present temperature. After the user touches the symbol of turning-on/off air conditioning, the symbol may change the color for indicating the air conditioner is turned-on or turned-off, and the user may identify the present status of the remote control accordingly. In other words, the touch device 1 of the present invention can cooperate with the traditional remote control or control panel and improve the display manner of each button of the remote control or the control panel. Accordingly, it may be easier for the user to identify functions of the remote control or the control panel.

Figure 4:
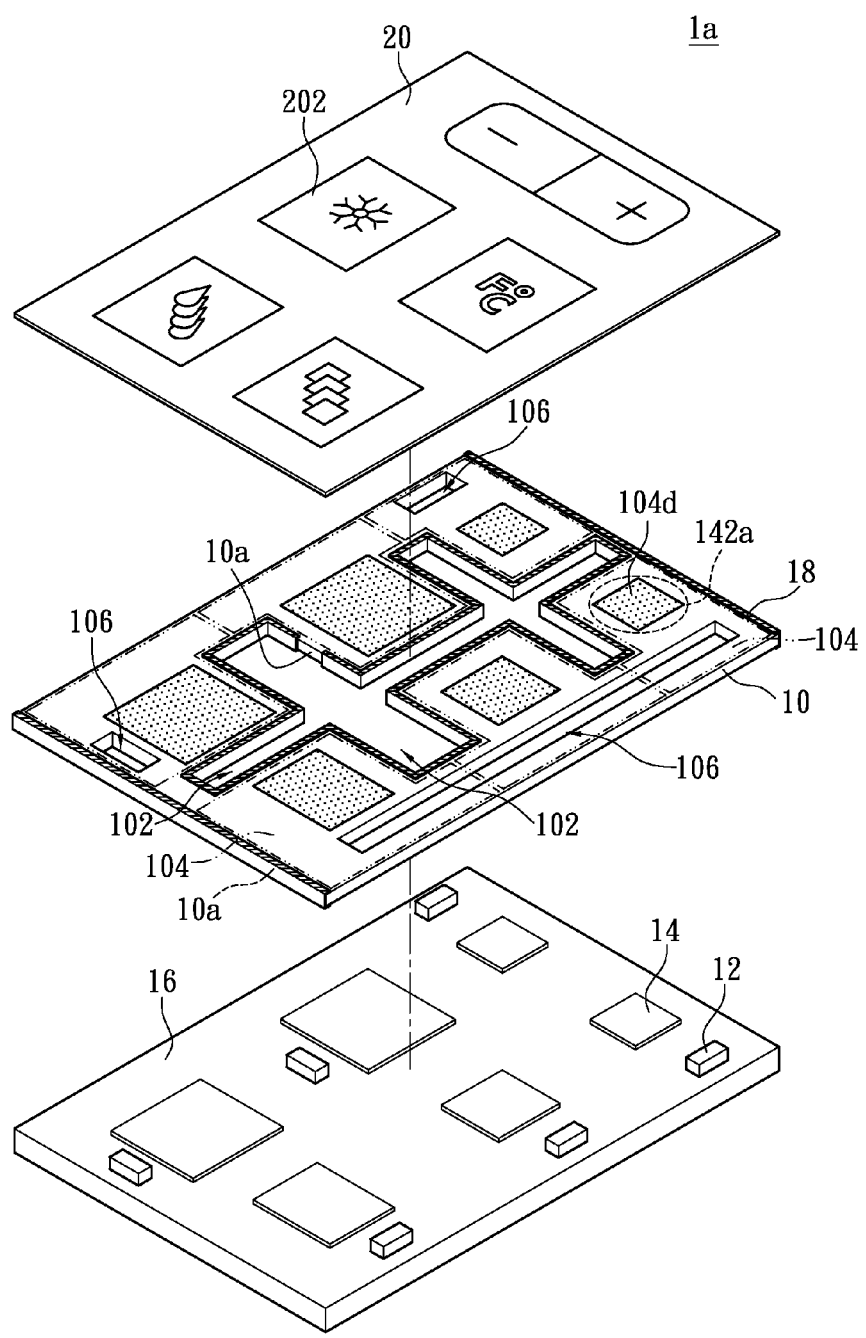
FIG. 4 shows an explosion diagram of a touch device according to a second embodiment of the present invention.

To ensure that the light would not be transmitted to the adjacent light guiding block 104, it is better that the emissive surfaces 104a of any two adjacent light guiding blocks 104 is not disposed face-to-face. That is, the two emissive surfaces 104a are not only separated by the air media of the isolating gap 102 but also separated by other adequate light-proof element. Please refer to FIG. 4 showing a second embodiment of the present invention. A major difference between the second embodiment and the first embodiment is that a light-proof element 18 is disposed on at least one of a plurality of lateral-side surfaces 10a of the light guide 10 of the touch device 1a in the second embodiment.

For real-world applications, the light-proof element 18 may be a light-proof tape used for covering at least one of the plurality of lateral-side surfaces 10a, such that the light can only penetrate the light guiding blocks 104 from the emissive surfaces 104b. The light-proof element 18 can cooperate with the light-emitting module 12 to form several gaps, such that the light-emitting module 12 can emit light into the light guiding block 104 of the light guide 10. The light-proof element 18 can be attached with paste or coated to the lateral-side of the light guide 10, but the assembling method is not restricted thereto. As long as the light-proof element 18 is disposed in the isolating gap 102 for isolating the light of the light guiding blocks 104, an artisan of ordinary skill in the art will appreciate how to change the material or alter assembling method.

Figure 5:
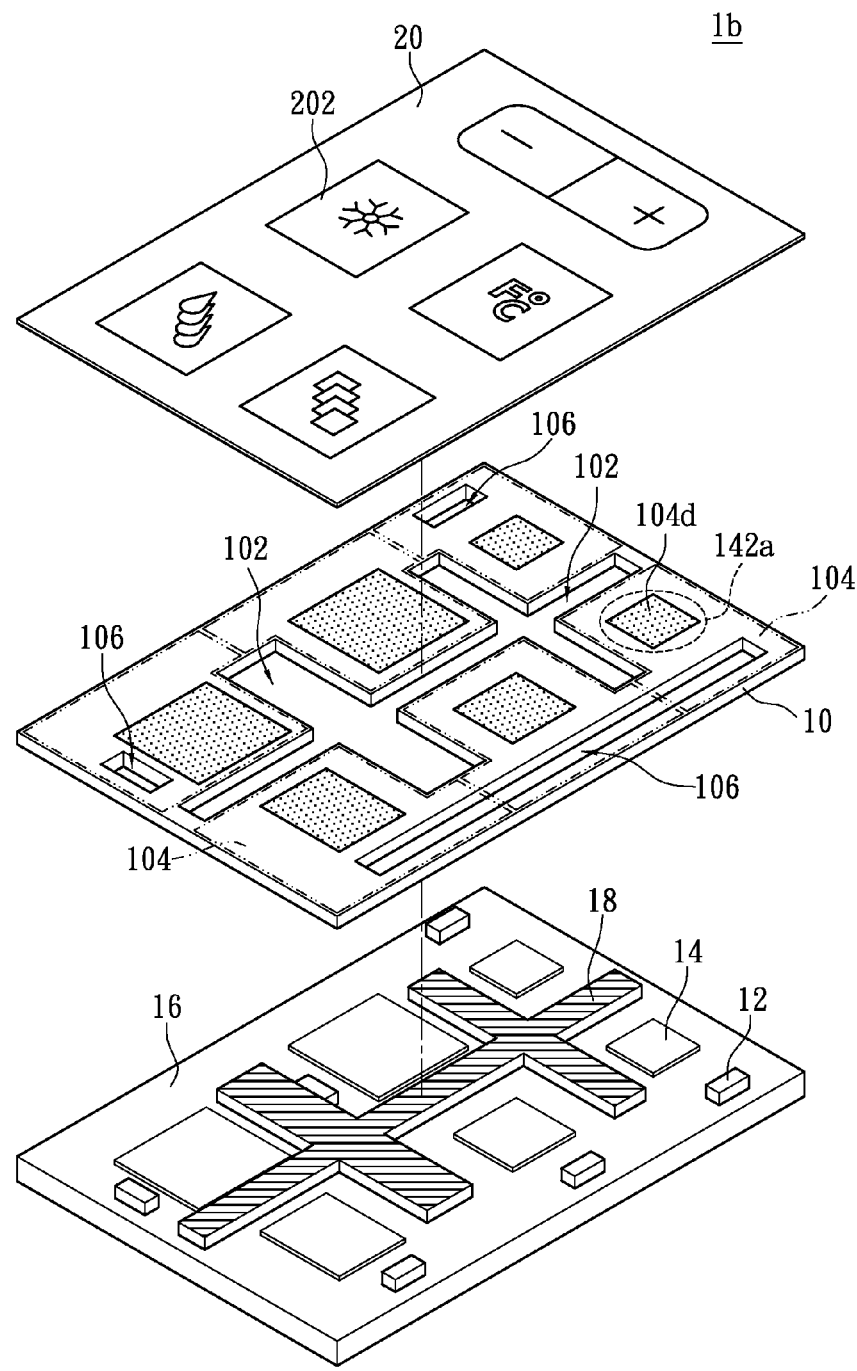
FIG. 5 shows an explosion diagram of a touch device according to a third embodiment of the present invention.

Please refer to FIG. 5 showing a third embodiment of the present invention. In the touch device 1b of the third embodiment, the light-proof element 18 does not directly contact the light guide 10 but is disposed in the isolating gap 102 so as to constrain the light of the light guiding blocks 104 to only penetrate from the emissive surface 104b. For real-world applications, the light-proof element 18 of the touch device 1b of the third embodiment may be a non-transparent material disposed on the substrate 16. The light-proof element 18 is used to shield part of the light which penetrates the light guiding blocks 104. That is, the light-proof element 18 is used to constrain the transmission of the light to a predetermined region (e.g. one of the light guiding blocks 104), such that the light can only penetrate from the emissive surface 104b to the predetermined region. Of course, the present invention may utilize a case for packaging the touch device 1b to be a part of the light-proof element 18, such that the associated cost may be cut down.

Please refer to FIG. 6 showing a fourth embodiment of the present invention. Differing from the touch device 1 of the first embodiment, the light guiding blocks 104' of the touch device 1c is not connected with each other, such that the light guide 10' has discrete light guiding blocks 104'. And the isolating gap 102 extend to the light guiding blocks 104' for forming the slot 106, wherein the light-emitting module 12 is disposed in the slot 106. Other components and functions of the fourth embodiment is in a similar manner as the first embodiment, thus the redundant information is not repeated.

Additionally, in a similar manner as the first embodiment, the light guiding blocks 104', the light-emitting module 12, and the touch sensing module 14 (refer to FIG. 2A) can form a light-emitting touch unit 3. Because the light guiding blocks 104' of the light guide 10' are independent, each light-emitting touch unit 3 can be an independent object. In fabrication process, the light guiding blocks 104' can be combined with the touch sensing module 14 in advance. And then, the light guiding blocks 104' combined with the touch sensing module 14 can be disposed on the substrate 16.

Figure 7:
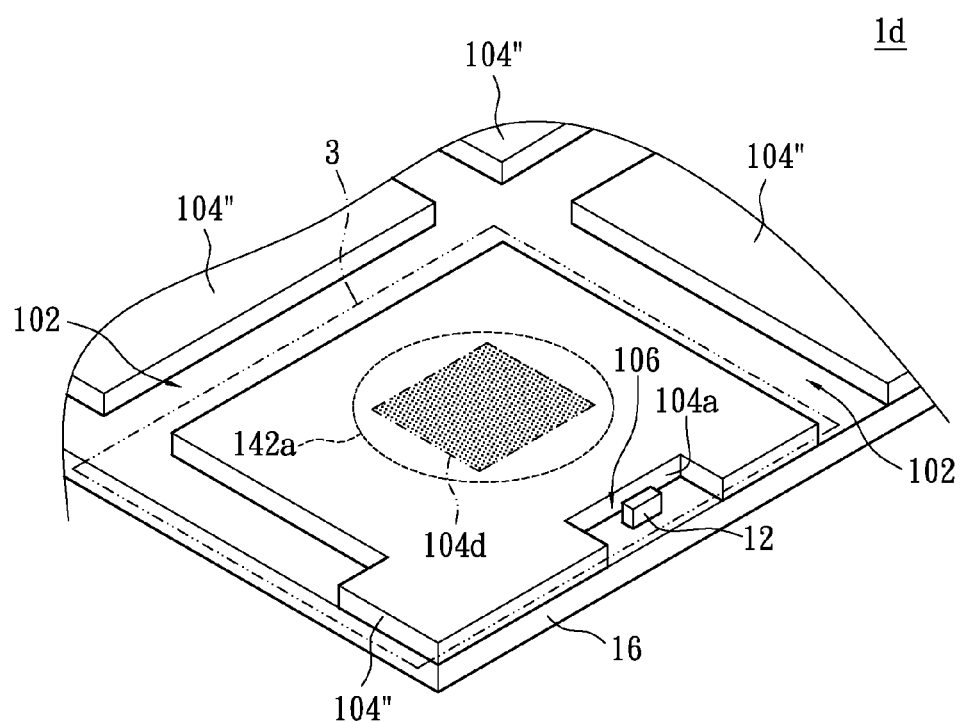
FIG. 7 shows a partial perspective diagram of a touch device according to a fifth embodiment of the present invention.

As shown in FIG. 7 showing a fifth embodiment of the present invention. The slot 106 used to contain the light-emitting module 12 may have a specific shape. For example, the edge of the light guiding blocks 104" can be notched to form the slot 106, such that the light emitting module 12 can be disposed in the slot 106. Differing from the fourth embodiment, each of the light guiding blocks 104" of the touch device 1d has a slot 106 to cooperate with the corresponding light-emitting module 12. In order to have the majority of the light emitted by the light-emitting module 12 to be transmitted to the light guiding block 104", the emissive surface 104a may be designed with a slot 106 to enclose or cover the light-emitting module 12. Thus, the slot 106 not only contains the light-emitting module 12 but assists the incident surface 104a to receive the light.

The shape of the slot 106 is not restricted thereto. As long as the slot 106 may assist the incident surface 104a to receive the light, the shape of the slot 106 may be a square, a semi-circle, a triangle, or other adequate shape.

In summary, the touch devices according to embodiments of the present invention dispose the light-emitting module at the lateral-side of the light guide, such that the total thickness of the touch devices may be reduced significantly. When utilizing the capacitive sensing technology, the sensitivity of the touch sensing module can be improved effectively. Additionally, by configuring the adequate isolating gap, the present invention can constrain the transmitting direction of the light in the light guiding block, such that the light transmitted from each light guiding block does not interfere with each other. When the user operates the touch device, the user can identify the light from each light guiding block more easily. Thus, it is easier to operate the remote control and control panel utilizing the present invention.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A touch device, comprising:
   a light guide, having a plurality of light guiding blocks, and at least one slot, each of the plurality of light guiding blocks including a side incident surface, a top emissive surface, a bottom surface, and, an isolating gap formed between any two adjacent light guiding blocks of the plurality of lighting guiding blocks to separate the two adjacent light guiding blocks, wherein the side incident surface of at least one first light guiding block is formed along the isolating gap and faces the isolating gap, and the light guide is a single plate;
   a plurality of light-emitting modules, disposed corresponding to the plurality of light guiding blocks, at least one first light-emitting modules being disposed in the isolating gap and each of the light-emitting modules being adjacent to the side incident surface of the corresponding light guiding block for emitting light that is guided to the corresponding light guiding block, and the light being guided out of the top emissive surface of the corresponding light guiding block; and
   a plurality of touch sensing modules, disposed correspondingly to the plurality of light guiding blocks, each of the plurality of touch sensing modules being disposed on the bottom surface of each of the plurality of light guiding blocks, wherein any one of the plurality of touch sensing modules generates a driving signal to control a corresponding light-emitting module of the plurality of light-emitting modules for emitting light when sensing a corresponding light guiding block of the plurality of light guiding blocks is touched.

2. The touch device according to claim 1, wherein the top emissive surface of each of the plurality of light guiding blocks has a light dispersive pattern layer for guiding the light generated by each of the plurality of light-emitting modules out of the light guide.

3. The touch device according to claim 2, wherein the light dispersive pattern layer is an ink pattern layer, a sandblasted pattern layer, or a printed dot pattern layer.

4. The touch device according to claim 1, further comprises a light-proof element disposed in the isolating gap, the light-proof element used for isolating the light guided from each of the plurality of light guiding blocks.

5. The touch device according to claim 4, wherein the light guide further has a plurality of lateral-side surfaces, and the light-proof element is a light-proof tape disposed in the isolating gap and is adhered to at least one of the plurality of lateral-side surfaces.

6. The touch device according to claim 4, wherein the light-proof element, the plurality of light-emitting modules, and the light guide are disposed on a substrate respectively.

7. The touch device according to claim 1, wherein the plurality of light-emitting modules and the plurality of touch sensing modules are respectively disposed on a substrate, and the light guide is disposed on the plurality of touch sensing modules.

8. The touch device according to claim 1, wherein each of the plurality of touch sensing modules comprises:
   a touch sensing conductor, sensing whether the corresponding light guiding block is touched by an object; and
   a touch sensing element, for detecting variation of the equivalent capacitance of the touch sensing conductor when the corresponding light guiding block is touched by the object, and according to the variation of the equivalent capacitance determine whether to output the driving signal to the corresponding light-emitting module, which is used to determine how to light the corresponding light-emitting module.

9. The touch device according to claim 1, further comprising:
   an indication panel having a plurality of transparent regions, the indication panel being disposed on the light guide and each of the plurality of transparent regions showing a symbol or a drawing pattern;
   wherein, the plurality of transparent regions are arranged correspondingly to the plurality of light guiding blocks, the light generated by the corresponding light-emitting module penetrates the top emissive surface of the corresponding light guiding block from a corresponding transparent region of the plurality of transparent regions.

10. The touch device according to claim 1, wherein the side incident surface is adjacent to the emissive surface and the bottom surface, and the emissive surface and the bottom surface are in parallel.

11. The touch device according to claim 1, wherein the side incident surface of at least one second light guiding block is formed adjacent to the at least one slot, and at least one second light-emitting module is disposed in the at least one slot.

12. A touch device, comprising:
    a plurality of light-emitting touch sensing units, each of the plurality of light-emitting touch sensing units including:
      a light guiding block, having at least an side incident surface, an top emissive surface, a bottom surface, and at least one slot;
      a light-emitting module, being adjacent to the side incident surface and emitting light to the light guiding block through the side incident surface, guiding the light out of the light guiding block through the top emissive surface; and
      a touch sensing module, disposed at the bottom surface, the touch sensing module being used to sense when the light guiding block is touched, so as to output a driving signal to control the light-emitting module accordingly;
    wherein, the light guiding block of each of the plurality of light-emitting touch sensing units is formed from a light guide with an isolating gap, the light guide is a single plate and the light-emitting module of at least one first light-emitting touch sensing units is disposed in the isolating gap, the side incident surface of the light guiding block of the at least one first light-emitting touch sensing unit is formed along the isolating gap and faces the isolating gap.

13. The touch device according to claim 12, wherein the top emissive surface has a light-dispersive pattern layer, the light-dispersive pattern layer is used to guide the light generated by the light-emitting module out of the light guiding block.

14. The touch device according to claim 12, wherein the touch sensing module including:
    a touch sensing conductor, sensing whether the light guiding block is touched; and
    a touch sensing element, detecting variation of the equivalent capacitance of the touch sensing conductor when the light guiding block is touched, and according to the variation of the equivalent capacitance determine whether to output the driving signal to the corresponding light-emitting module, which is used to determine how to light the corresponding light-emitting module.

15. The touch device according to claim 12, further comprising:

an indication panel having a plurality of transparent regions, the indication panel being disposed on the light guide, each of the plurality of transparent regions showing a symbol or a drawing pattern;

wherein, each transparent region corresponds to the light guiding block of a corresponding light-emitting touch sensing unit of the plurality of light-emitting touch sensing units, the light generated by the light-emitting module penetrates the top emissive surface from the transparent region.

16. The touch device according to claim 12, wherein the light-emitting module and the touch sensing module are disposed on a substrate separately, and the light guide is disposed on the touch sensing module.

17. The touch device according to claim 12, further comprising a light-proof element disposed in the isolating gap, the light-proof element isolating light guided from the light guiding block of each of the plurality of light-emitting touch sensing units.

18. The touch device according to claim 17, wherein the light guide further has a plurality of lateral-side surfaces, and the light-proof element is a light-proof tape disposed in the isolating gap and adhered to at least one of the plurality of lateral-side surfaces.

19. The touch device according to claim 17, wherein the light-proof element, the light-emitting module, and the light guide are disposed on a substrate separately.

20. The touch device according to claim 12, wherein the side incident surface of the light guiding block of at least one second light-emitting touch sensing unit is formed adjacent to the at least one slot, and the light-emitting module of the at least one second light-emitting touch sensing unit is disposed in the at least one slot.

* * * * *